United States Patent [19]
Liu et al.

[11] Patent Number: 5,415,891
[45] Date of Patent: May 16, 1995

[54] METHOD FOR FORMING METAL-OXIDE-MODIFIED POROUS CERAMIC MEMBRANES

[75] Inventors: Paul K. T. Liu; Jeffrey C. Wu, both of O'Hara Township, Allegheny County, Pa.

[73] Assignee: Media and Process Technology Inc., Pittsburgh, Pa.

[21] Appl. No.: 179,614

[22] Filed: Jan. 10, 1994

[51] Int. Cl.⁶ ..................... B05D 5/00; C23C 16/40
[52] U.S. Cl. ............................ 427/243; 427/244; 427/255.3; 427/255.2; 427/255.1; 427/248.1; 95/55; 96/11
[58] Field of Search ............... 427/255.3, 255.2, 255.1, 427/248.1, 243, 244; 55/16

[56] References Cited

U.S. PATENT DOCUMENTS 4,902,307  2/1990  Gavalas et al. .................... 55/16
5,332,597  7/1994  Carolan et al. ................... 427/243

OTHER PUBLICATIONS

Burggraaf, A. J. and Keizer, K. "Synthesis of Inorganic Membranes," Chapter 2, p. 10, Editor: R. R. Bhave, *Inorganic Membrane Synthesis, Characterization and Applications,* (Van Nostrand Reinhold, New York, 1991).
Fain, D. E., "A Dynamic Flow–Weighted Pore Size Distribution Test," *DOE Report,* Oak Ridge Gaseous Diffusion Plant, Tennessee, 1989, pp. 1–18.
J. C. S. Wu, D. F. Flowers, and P. K. T. Liu, "High–Temperature Separation of Binary Gas Mixtures Using Microporous Ceramic Membranes," *J. Membrane Science,* vol. 77, p. 85 (1993).
Wefers, K. and Misra, C. "Oxides and Hydroxides of Aluminum," *Alcoa Technical Paper No. 19,* Alcoa, Pittsburgh, Pa. (1987), pp. 1–92.
Okubo, T. and Inoue, H., "Introduction of Specific Gas Selectivity to Porous Glass Membranes by Treatment With Tetraethoxysilane," *J. Membrane Science,* vol. 42, p. 109 (1989).
Gavalas, G. R., Megiris, C. E., and Nam, S. W., "Deposition of H2–Permselective SiO2 Films," *Chemical Engineeriing Science,* vol. 44(9), p. 1829, (1989).
Tsapatsis, M., Kim, S., Nam, S. W. and Gavalas, G., "Synthesis of Hydrogen Permselectivity SiO2, TiO2, Al2O3 and B2O3 Membranes From The Chloride Precursors," *Ind. Eng. Chem. Res.,* vol. 30(9), p. 2152 (1991).
Ioannides, T. and Gavalas, G. R., "Catalytic Isobutane Dehydrogenation in a Dense Silica Membrane Reactor," *J. Membrane Science,* vol. 77, p. 207 (1993).
Megiris, C. E. and Glezer, J. H. E., "Synthesis of H2–permselective Membranes by Modified Chemical Vapor Deposition. Microstructure and Permselectivity of SiO2/Vycor Membranes," *Ind. Eng. Chem. Res.,* vol. 31, p. 1293 (1992).

*Primary Examiner*—Roy V. King
*Attorney, Agent, or Firm*—Douglas G. Glantz

[57] ABSTRACT

A novel membrane preparation process via chemical vapor deposition (CVD) deposits a film on a microporous ceramic support at a low temperature (300° to 550° C.) with organic metallic compounds as precursors and then converts the film into porous oxide at a higher temperature (350° C. to 800° C., preferably 450° C. to 600° C.) to increase its permeability and stability at a given process application temperature. The novel membrane is used for gas separations at an elevated temperature (300° C. to 800° C.). The novel membrane can be used as a catalytic membrane reactor which selectively removes one of the reaction products, thereby enhancing the conversion of the reaction. The ultrafiltration membrane provides gaseous mixtures separation media having high permeance and superior hydrogen selectivity.

20 Claims, 5 Drawing Sheets

METHOD FOR FORMING METAL-OXIDE-MODIFIED POROUS CERAMIC MEMBRANES

BACKGROUND OF THE INVENTION

1. Technical Field

This invention relates to ultrafiltration membranes and the methods for making and using such ultrafiltration membranes to provide gaseous mixtures separation media at elevated temperatures. In one aspect, the invention relates to such ultrafiltration membranes to provide gaseous mixtures separation media having superior hydrogen selectivity.

2. Background

Porous ceramic membranes composed of metallic oxides, such as oxides of aluminum, silicon, zirconium, and titanium, have been suggested and used for high temperature separations processes ranging from <200° C. to >600° C. The membrane could be in the form of tubular, disk, or monolithic configurations. The effective membrane layer is usually very thin, e.g., such as typically 1 to 100 microns and is supported by a very porous, thick ceramic substrate. The porous structure of the membrane layer is formed by the metal oxide network, wherein a molecule can selectively permeate through to achieve the high temperature separations processes.

Existing commercial ultrafiltration membranes are typically prepared by depositing a suspended sol containing aluminum or silicon onto a porous ceramic substrate with a pore size of $\geq 0.2$ micron as support. After deposition, the material is calcined at a temperature higher than about 450° C. to obtain a pore size ranging from 40 Å to <0.2 micron. Details about ceramic membrane synthesis and applications can be found in Chapter 2 of *Inorganic Membrane Synthesis, Characteristics and Applications* (Van Nostrand Reinhold, New York, 1991) by R. R. Bhave.

Membranes also can be prepared by other methods. For example, vycor glass membranes are prepared from etching of the glass. The pore size in a vycor glass membrane depends on the control of the defect size resulting from the etching.

To date, 40 Å is the smallest nominal pore size commercially available for inorganic membranes. By nominal pore size is meant the flow-weighted pore size as determined by the method described by D. E. Fain in "A Dynamic Flow-Weighted Pore Size Distribution," Proceedings of the First International Conference on Inorganic Membranes, Montpellier, France, 1989.

A membrane with a nominal pore size as small as 40 Å can perform gas separations based upon Knudsen diffusion, i.e., the selectivity approximating the square root of the molecular weight ratio. For example, in the separation of a gaseous mixture containing hydrogen and nitrogen, the selectivity of the membrane would be about 3.74 (square root of 28/2). In a simplified explanation of the selectivity, one nitrogen molecule leaks through with every 3.74 molecules of hydrogen permeated through the membrane. A separation efficiency as low as 3.74 is insufficient for most industrial gas separation processes. Details on the gas separations using microporous ceramic membranes can be found in "High Temperature Separation of Binary Gas Mixtures Using Microporous Ceramic Membranes," by J. C. S. Wu, D. F. Flowers, and P. K. T. Liu, *J. Mem. Sci.* Vol. 77, pp. 85–98 (1993).

In addition to selectivity, membrane stability at the elevated temperature (i.e., 200° C. and above) is another critical factor. To achieve membrane material stability, the oxide normally is required to be thermally treated at a temperature higher than the contemplated process application temperature because particles of the oxide network tend to sinter (aggregate) under long term exposure to a temperature higher than the preparation temperature. This sintering phenomenon is purely thermodynamic since particles tend to aggregate together to minimize their free energy. Treatment of the material at the contemplated or proposed process application temperature makes the material reach a "steady state" corresponding to the operation temperature. A similar material stability issue has been discussed in the literature for these materials in non-membrane configurations, such as for activated alumina (Oxides and Hydroxides of Aluminum, Alcoa Technical Paper No. 19, Revised, by K. Wefers and C. Misra, Alcoa Laboratories, Aluminum Company of America, Pittsburgh, Pa., 1987) and for other porous oxides.

The membrane material aggregation process of sintering involves a serious drawback for separations in that the densification of the porous membrane usually degrades permeate flux. Eventually, the membrane material becomes non-porous and is usually associated with cracks which reduce separation selectivity dramatically.

In the past few years, several techniques have been proposed to modify metal oxide membranes via pore size reduction of the existing membrane by methods other than sintering to enhance separation selectivity at the high temperature. Pore constriction processes by chemical vapor deposition of metal oxides or carbon, by precipitation of metals, or by in-situ crystallization of zeolite have been proposed previously. In addition to the pore size reduction via pore constriction, these techniques also have been applied to introduce an additional layer, of a smaller pore size, onto the existing membrane layer. Improvement of the separation selectivity through these modifications has been reported in the literature.

For example, using chemical vapor deposition to reduce pore size, Okubo and Inoue ("Introduction of Specific Gas Selectivity to Porous Glass Membranes by Treatment With Tetraethoxysilane," in *J. Membrane Science* Vol. 42, p.109 (1989)) deposited a silicon-containing layer onto a porous glass membrane at 200° C. using tetraethyl orthosilicate (TEOS) as a precursor. The membrane thus developed exhibited hydrogen permeance of 0.0447 m$^3$/m$^2$/bar/hr and selectivity of ~11 over nitrogen at the pursued gas separation temperature of 200° C. Okubo and Inoue further suggested that the separation was based upon activated diffusion through the microporous membrane and Knudsen diffusion through cracks and/or macropores. No deposition or separation studies at temperatures higher than 200° C. were reported.

Theoretically, one could form a dense film as a membrane; thus, migration of particles could be minimized. The dense film suffers a low permeate flux, although the selectivity could be improved dramatically. The extreme case of the dense structure involves a dense film where molecules pass through the membrane based on the solid-phase solution-diffusion mechanism. Under these circumstances, the selectivity could be extremely high while permeability is too low to become practical. For example, in the work reported by Gayalas et al., ("Deposition of $H_2$-Permselective $SiO_2$ Films," by G. R. Gayalas, C. E. Megiris, and S. W. Nam in *Chemical Engineering Science* Vol. 44(9), p.1829 (1989)), a dense phase membrane applied through vapor phase deposition at 450° C. was suggested with a selectivity number of several thousands for hydrogen over nitrogen, while the permeance of hydrogen ranged from 0.11 to 0.33 $m^3/m^2/atm/hr$ at 450° C. A tremendously high surface area of this dense film type membrane was required for operation in petrochemical and oil refinery operations handling a large volume of streams.

Modified membranes with $SiO_2$, $TiO_2$, $Al_2O_3$, and $B_2O_3$ were produced by Tsapatsis et al. ("Synthesis of Hydrogen Permselectivity $SiO_2$, $TiO_2$, $Al_2O_3$, and $B_2O_3$ Membranes from the Chloride Precursors," in *Ind. Eng. Chem. Res.* Vol. 30(9), p. 2152 (1991). The metallic precursors included chlorides of the metals. The deposition temperatures varied, e.g., 600°-800° C. for $SiCl_4$, 450° -600° C. for $TiCl_4$, 450°-800° C. for $AlCl_3$, and 100°-450° C. for $BCl_4$. The carrier gas included water to convert the metallic chloride into metal oxide and hydrogen chloride during deposition. Again, the hydrogen permeance ranged from 0,002 to 0.21 $m^4/m^2/atm/bar$. Further treatment at a higher temperature, called thermal annealing, resulted in a lower permeate flux because of the densification of the membrane structure. For example, in Gayalas et al., U.S. Pat. No. 4,902,307, the hydrogen flux decreased from 11.0 $m^3/m^2/atm/hr$ (after deposition at 450° C.) to 4.2 $m^3/m^2/atm/hr$ (after the film was heated for 18 hours at 600° C.), and then to 2.3 $m^3/m^2/atm/hr$ (after one additional day at 600° C.), while the nitrogen flux increased to 0.28 $m^3/m^2/atm/hr$. The permeance data presented in FIG. 3 of the Gayalas et al. patent, however, was on the order of $10^{-2}$ to $10^{-3}$ $m^3/m^2/atm/hr$ for hydrogen at 200°-600° C.

In addition to metal chlorides, $SiH_4$ has been used by Gayalas et al. (Gavalas, Megiris, and Nam, 1989) as precursors with the carrier gas containing oxygen. $SiH_4$ was converted to $SiO_2$ during the deposition at 450° C. (T. Ioannides & G. R. Gavalas, "Catalytic Isobutane Dehydrogenation in a Dense Silica Membane Reactor," *J. Mem. Sci.* Vol. 77, page 207 (1993)) and (G. E. Megeris and J. H. E. Glezer, "Synthesis of $H_2$-Selective Membrane by Modified Chemical Vapor Deposition, Microstructure and Permselectivity of $SiO_2$/C/Vycor Membranes," *Ind. Eng. Chem. Res.* Vol. 31, pp. 1293-1299 (1992)).

INTRODUCTION TO THE INVENTION

Thus far, prior art processes have limited the chemical vapor deposition (CVD) modification of membranes at the process application temperature. Thus, conventional membranes are stable at a given process application temperature. However, most of the permeances of such membranes prepared by a one-step CVD have been very limited, i.e., $<<1$ $m^3/m^2/atm/hr$ of hydrogen. It is believed that the film Okubo et al. developed is a silicon-containing thin film which contains an organic precursor or its by-products at 200° C. The film was not fully converted into inorganic oxide which requires a much higher temperature. Since the process application Okubo et al. pursued was 200° C., the membrane stability was believed satisfactory. Deposition at a higher temperature was attempted by Gayalas et al. as described above. However, the use of an inorganic precursor at those temperatures resulted in a dense structure with extremely low permeability. Post-treatment in the presence of nitrogen and water was performed at a higher temperature to anneal the structure, resulting in a more stable, but lower permeance membrane, indicating the sintering of the structure.

A separate report by Pliskin (Pliskin, W. A., "Comparison of Properties of Dielectric Films Deposited by Various Methods," *J. Vac Sci. Technology* Vol. 14, p. 1064 (1977)) indicated that films grown by silane oxidation were densified by thermal annealing. An organic precursor, such as triisopropylsilane, was used by Megiris and Glezer (G. E. Megeris and J. H. E. Glezer, "Synthesis of $H_2$-Selective Membrane by Modified Chemical Vapor Deposition, Microstructure and Permselectivity of $SiO_2$/C/Vycor Membranes," *Ind. Eng. Chem. Res.* Vol. 31, pp. 1293-1299 (1992)) to deposit a $SiO_2$/C film at 750° C. with a $H_2$ permeance of 0.095 to $\sim 0.21$ $m^3/m^3/atm/hr$ at 750° C. Similar to the previous studies, thermal annealing at a higher temperature (850° C.) was performed and resulted in the consolidation of the film structure, i.e., permeance reduction.

There are many significant and costly problems and drawbacks associated with the utilization of one-step chemical vapor deposition in conventional or prior art methods. One principal problem is a permeance generated from the membranes produced from conventional methods which is too to be practical.

Another drawback is the further reduction of the permeance if thermal annealing is applied at a temperature higher than the deposition temperature.

A further drawback is the requirement for the requirement for handling corrosive by-products, e.g., such as HCl, at a high temperature for a precursor containing chlorine.

Therefore, it is an object of the present invention to provide a novel process to produce a membrane for gaseous mixtures separations at elevated temperatures.

It is another object of the present invention to provide a novel process to produce a membrane for gaseous mixtures separations at elevated temperatures, the membrane having an improved permeance.

Another object of the present invention is to provide a novel process to produce a membrane with an improved permeance by a chemical vapor deposition.

It is another object of the present invention to provide a novel process to produce a membrane with an improved permeance and with thermal stability at elevated temperatures.

Another object of the present invention is to provide a process to produce a membrane with an improved permeance by a chemical vapor deposition while maintaining a selectivity higher than Knudsen separation as provided by conventional or existing membranes.

It is another object of the present invention to produce a high permeance, high selectivity membrane which is practical for industrial applications dealing with a large volume of gas streams.

It is another object of the present invention to use a high permeance, high selectivity membrane as a gas separator.

It is another object of the present invention to use a high permeance, high selectivity membrane as a gas separator and catalytic membrane reactor.

These and other objects of the novel chemical vapor deposition apparatus and membrane and process of making and process of using of the present invention will become apparent to those skilled in the art from a careful review of the detailed description which follows.

SUMMARY OF THE INVENTION

The present invention includes a novel membrane preparation process via chemical vapor deposition (CVD) by depositing a film on a microporous ceramic support at a low temperature (300° to 550° C.) with organic metallic compounds as precursors and then converting the film into porous oxide in the presence of oxidant at a higher temperature (350° C. to 800° C., preferably 450° C. to 600° C.) to increase its permeability and stability at a given process application temperature. In one aspect of the present invention, the novel membrane thus provided is used for gas separations at an elevated temperature 300° C. to 600° C. In yet another aspect of the present invention, the novel membrane thus produced is used as a catalytic membrane reactor which selectively removes one of the reaction products, thereby enhancing the conversion of the reaction.

DETAILED DESCRIPTION

Figure 1:
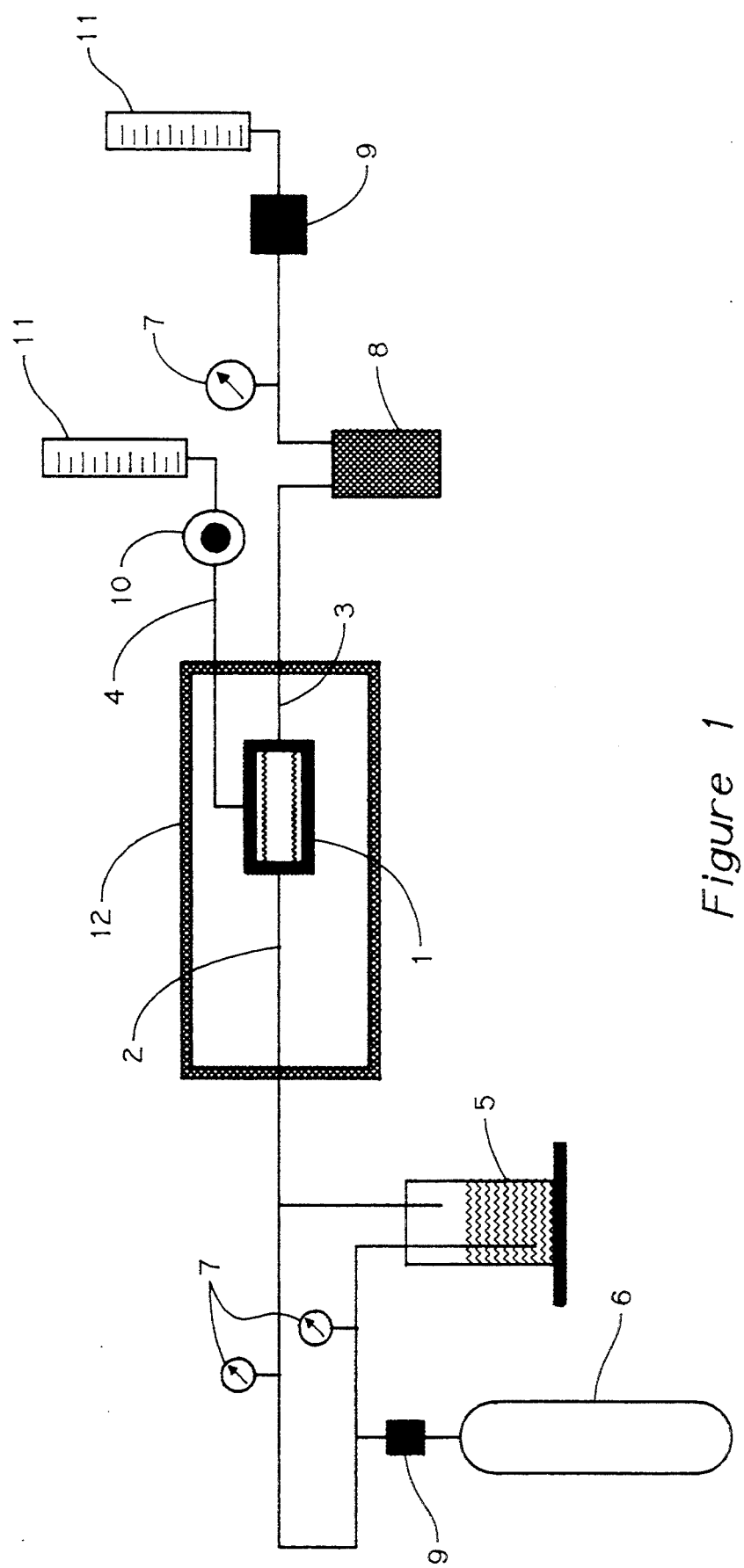
FIG. 1 shows a schematic of the chemical vapor deposition apparatus and process of the present invention.

Referring now to FIG. 1, experimental apparatus for the chemical vapor deposition (CVD) process of the present invention is shown. A tubular membrane was used as starting material in this illustration, which tubular membrane was packed inside a stainless steel housing shown as module 1. Module 1 contained an inlet 2 in the tube side for the feed and an outlet 3 in the other end for reject of the feed. Also, permeate through the membrane was discharged through the shell side 4. Other module configurations can be used depending upon the membrane geometry.

The organometallic precursor was carried into module 1 by bubbling He/O$_2$ mixture through vaporizer 5. Carrier gas 6, containing helium and oxidant after mixing with the organometallic compounds as precursors, was introduced into module 1 as a deposition chamber. The concentration of the organometallic compound was controlled by the temperature of vaporizer 5 and the ratio of the components of the individual streams.

If the membrane of module 1 had been stored for a long time, moisture and unknown organic vapor could be trapped in the pores. Before deposition, the membrane of module 1 was heated from room temperature to a specified deposition temperature. Usually, it takes 2 hours to stabilize the temperature. During this period, moisture and organic vapor should be removed. Pressure gauges 7 were installed in the feed, reject, and permeate lines for monitoring purposes.

A condenser 8 was installed in the reject line to trap unreacted organic metallic compounds and their by-products before discharging to the atmosphere. Mass flow controllers 9 were installed in the feed and discharge line to control the flow rates. Back pressure regulators 10 were installed in the permeate and reject lines. A bubble meter 11 was installed to measure the flow rate of the permeate and the reject. The temperature of the CVD process was controlled by placing the deposition chamber in furnace 12.

Operating Conditions

The operating conditions can be controlled by deposition time and temperature. Deposition time is one of the key parameters to controlling pore size. Generally, for longer deposition times, smaller pore sizes are obtained. Eventually, a non-porous membrane could be obtained after an extended deposition time. For gas separations, such as hydrogen enrichment, the deposition is complete when the on-line permeate measurement shows a nearly no flow, e.g., such as about only 10 cc/min. At 300° C., the deposition in the first two hours has no or little effect on the pore reduction. The pore reduction starts after about two and a half hours of deposition. The higher the temperature, the shorter is the deposition time required. The deposition temperature is also a very important parameter to control the quality of the resulting membrane. The deposition temperature studied ranged from 300° C. to 600° C. Deposition at a low temperature and subsequent post-treatment at a higher temperature usually gave a higher selectivity and permeance. It is possible that the low temperature deposition produced more porous silicate film inside the pore, while less porous (i.e., denser) silicate film was obtained through deposition at a higher temperature. However, the low temperature deposition without subsequent post-treatment gave a less stable membrane.

Post-Treatment

After deposition, the membrane was first purged at the same gas flow (He/O$_2$) without tetraethyl orthosilicate (TEOS). The deposited film was then oxidized at a higher temperature, i.e., 300° C. to ~800° C., mostly 600° C., for 12 hours. This step completed the conversion of the metallic precursors into metal oxides and also burned out any organic residues from TEOS after deposition. Thus, an oxide film with an improved permeability and stability at the oxidation temperature was produced.

Although we do not intend to be bound by the mechanism described here, we believe that the improved material stability and performance can be explained by the following mechanism. At a low temperature deposition, a thin film of the oxide precursor was deposited through the vapor phase deposition. The film could be simply a condensed precursor or possibly a polymeric network at the deposition temperature. This film was very likely nonporous liquid film. Then the film was converted into its oxide form in the presence of oxygen at a higher temperature. During the conversion, the organic groups of the precursor release and leave behind the porous structure allowing selective permeation of certain molecules. Deposition at a high temperature (e.g., 600° C.) was likely to form a silica oxide film directly since the organic groups release before deposition. As a result, a tight film was formed. By tight film is meant low porosity for transport conduits for hydrogen and other gases. The tight film was observed to provide a high selectivity with the sacrifice of permeation.

If the deposition temperature is too low, the vaporization of the deposited film during the post-treatment could occur which may cause the defect of the film. The deposited film should be stable if a polymeric bonding exists within the deposited film. Consequently, the loss of the organic metallic compounds would not occur before the conversion at a higher temperature. The actual deposition temperature depends upon the precursor's physical and chemical properties.

EXAMPLE I

Silica modification of ceramic membranes with a nominal 40 Å pore size (available commercially from U.S. Filter Corporation of Warrendale, Pa.) was performed using TEOS as a precursor. Helium containing 10 to 20% of oxygen by volume was chosen as a carrier gas for introducing TEOS from the vaporizer into the membrane. The vaporizer was set at room temperature, i.e., ~21° C. The feed and the reject rates were regulated by mass flow meters and controllers. About 1% of TEOS was achieved by controlling the vaporizer at 20° C.

The permeation rate was monitored and determined with a soap-film meter. The feed pressure varied from 0 to 60 psi throughout the deposition processes. The deposition was performed at 300° C. for 50 to 250 minutes. Then the membranes were post-treated in the presence of oxygen for 12 hours.

Figure 2:
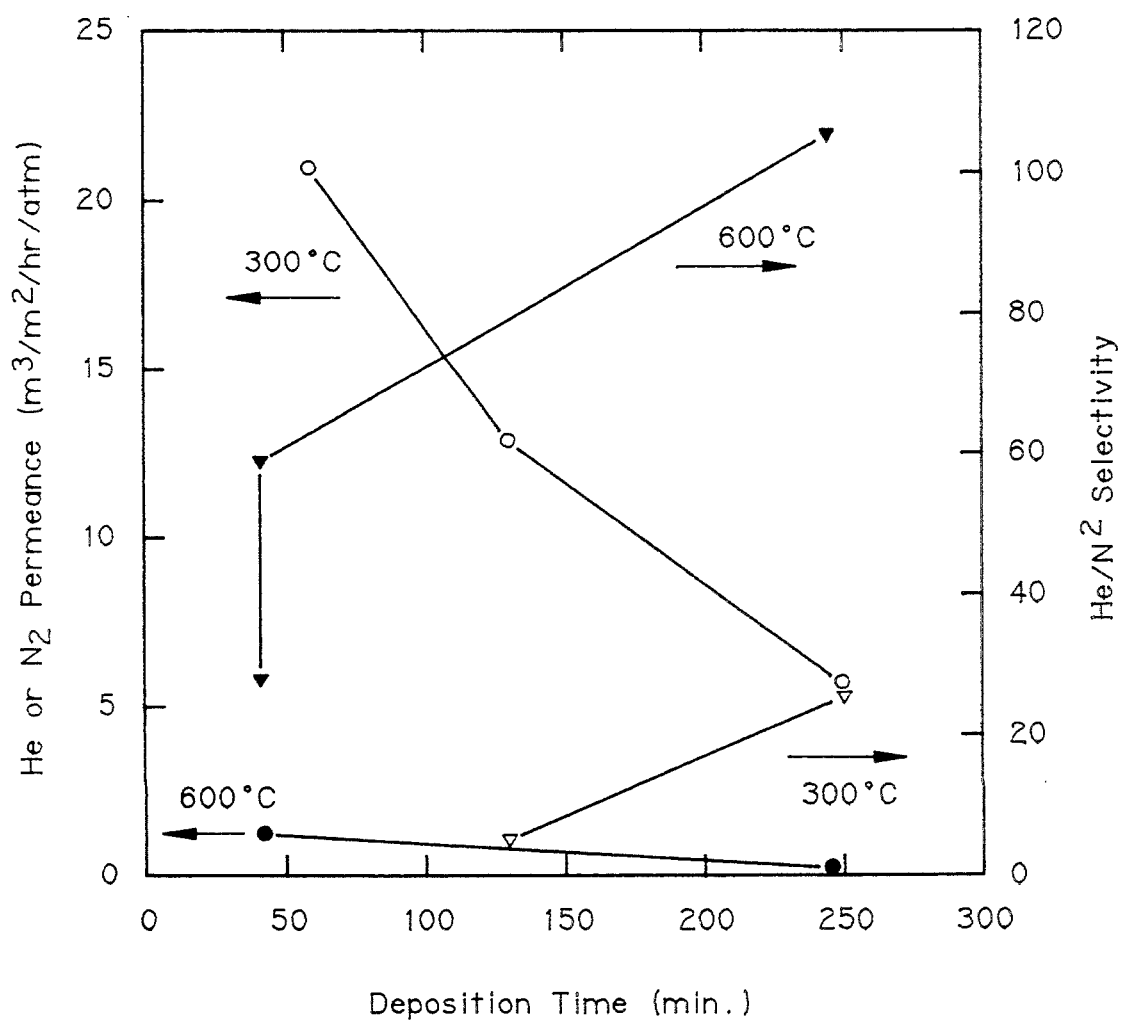
FIG. 2 shows a graph depicting the effect of deposition temperature prior to oxidation at 600° C.

The resulting permeance and selectivity are summarized in Table 1 and presented in FIG. 2. The membrane with deposition for 250 minutes showed a helium selectivity of 25 associated with a gas permeation of ~7 $m^3/m^2/atm/hr$. Deposition for 130 minutes resulted in ~12.5 $m^3/m^2/atm/hr$ and selectivity of 2. As a comparison, a similar study was performed for deposition at 600° C. for 40 and 245 minutes. This resulted in the products with 1 $m^3/m^2/atm/hr$ and 20–60 of selectivity, and 0.01 $m^3/m^2/bar/hr$ and 110 respectively. The deposition at a lower temperature and then the post-treatment in the presence of oxygen at a higher temperature resulted in a membrane with a much higher permeance while maintaining a moderate selectivity, compared with the membrane deposited at the higher temperature without post-treatment.

EXAMPLE II

Figure 3:
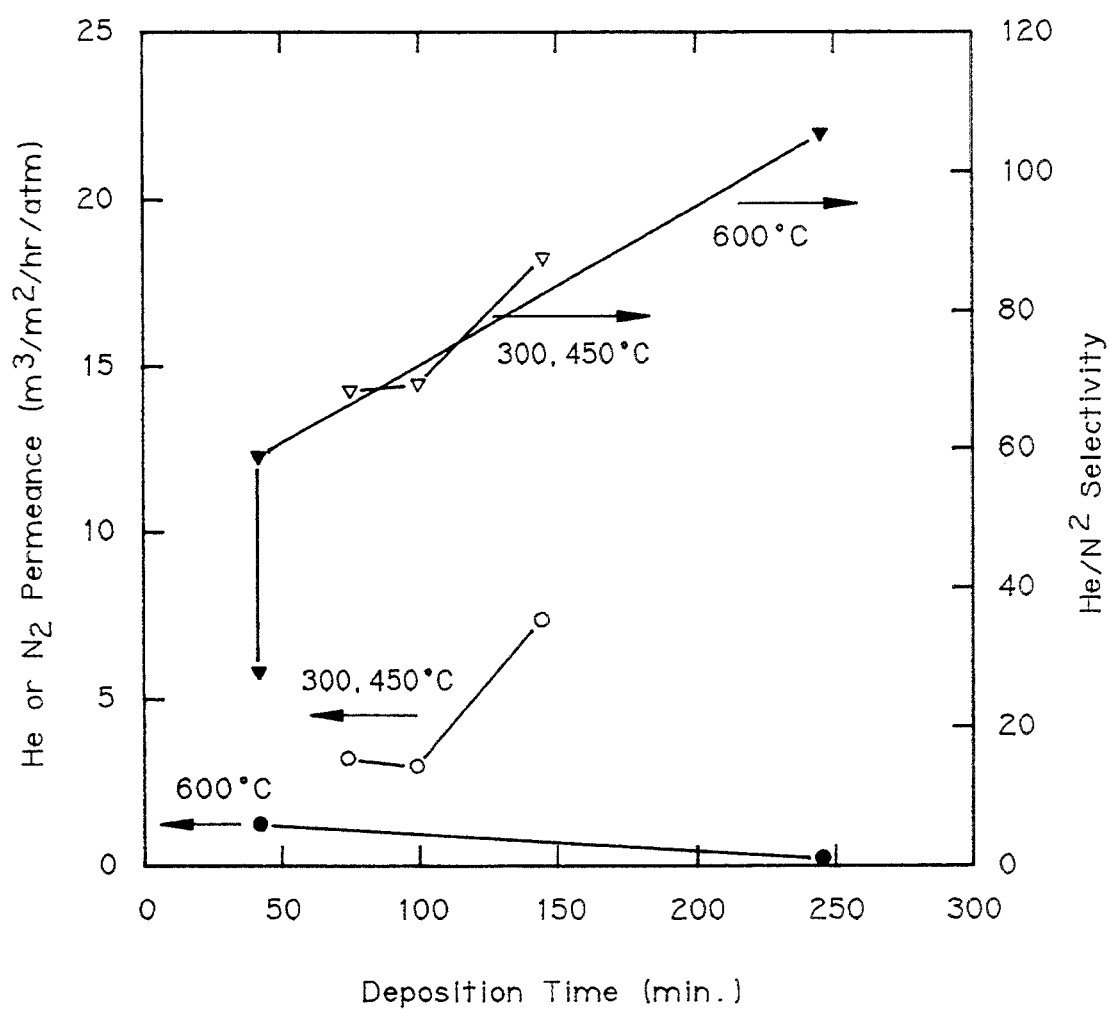
FIG. 3 shows a graph depicting the effect of deposition temperature prior to calcination with nitrogen at 600° C.

A similar study as described in Example I was performed for calcination at 600° C. under nitrogen as post-treatment. The separation properties of the membranes thus found are summarized in Table 2 and FIG. 3. The selectivities (for deposition at 600° C. and then calcined at the same temperature at 600° C.) were similar to those deposited at 300° and 450° C. However, the permeance for the deposition at 300° and 450° C. was nearly double that at 600° C. It should be noted that both membranes underwent post-treatment at 600° C. in the presence of nitrogen. However, the deposition at a lower temperature exhibited a much higher permeance. The membrane thus developed showed deposition with black color, evidently the formation of carbon or carbide taking place during the post-treatment. The carbon-containing membrane was not stable under an oxidation environment at the high temperature.

TABLE 2

The Effect of Deposition Temperature with Post Treatment under Nitrogen

| Time (min) | Deposition T (°C.) | Post Treatment T (°C.) | He Permeance (m3/m2/hr/atm) | He/N2 |
|---|---|---|---|---|
| 75 | 450 | 600 | 3.2 | 68.5 |
| 100 | 450 | 600 | 3.0 | 69.5 |
| 145 | 300 | 600 | 7.3 | 87.6 |
| 41 | 600 | 600 | 1.2 | 58.1 |
| 42 | 600 | 600 | 1.1 | 27.2 |
| 245 | 600 | 600 | 0.19 | 105 |

EXAMPLE III

Several ceramic membranes (U.S. Filter Corporation) with 40 Å pore size were used as starting materials for pore size reduction. Deposition at 300° C. was performed first, then they were calcined at 600° C. in the presence of oxygen.

The properties of the starting materials and the hydrogen separation efficiency at 600° C. of the resulted membranes were listed in Table 3a and 3b. The permeance of helium at 600° C. ranges from 6.02 to 14.28 $m^3/m^2/atm/hr$, which are several orders of magnitude higher than those reported by the prior arts.

TABLE 1

The Effect of Deposition Temperature with Post Treatment under Oxygen-containing Atmosphere

| Time (min) | Deposition T (°C.) | Post Treatment T (°C.) | He Permeance (m3/m2/hr/atm) | He/N2 |
|---|---|---|---|---|
| 60 | 300 | 600 | 20.9 | — |
| 130 | 300 | 600 | 12.9 | 4.9 |
| 250 | 300 | 600 | 5.7 | 25.2 |
| 41 | 600 | 600 | 1.2 | 58.1 |
| 42 | 600 | 600 | 1.1 | 27.2 |
| 245 | 600 | 600 | 0.19 | 105 |

TABLE 3a

Detailed Conditions of Chemical Vapor Deposition (CVD)

| Mem. ID | Permeance (before CVD) | | CVD | | Post Treatment (O2 atmosphere) | | Feed Rate | Initial Conditions | | Final Conditions | | |
|---|---|---|---|---|---|---|---|---|---|---|---|---|
| | He (m3/m2/atm/hr) | N2 (m3/m2/atm/hr) | T (°C.) | time (min) | T (°C.) | time (hr) | He/O2 (cc/min) | Reject (cc/min) | Permeate (cc/min) | Reject (cc/min) | R. P. (psig) | Permeate (cc/min) |
| Si235 (1" length) | — | 37.0 | 300 | 180 | 600 | 12 | 58.1 | 50.5 | 13.4 | 53.2 | 0+ | 2.9 |
| Si483 (10" length) | 84.5 | 29.6 | 300 | 420 | 600 | 12 | 292.7 | 182.9 | 102.6 | 250.0 | 3.0 | 23.0 |

TABLE 3b

The He and N2 Permeances of 1 and 10" tubes*

| Temperature (°C.) | Si235 (1") | | | Si483 (10") | | |
|---|---|---|---|---|---|---|
| | Permeance | | He/N2 | Permeance | | He/N2 |
| | He | N2 | | He | N2 | |
| 25 | 1.97 | 0.94 | 2.1 | 0.46 | 0.11 | 4.2 |
| 300 | 8.99 | 0.20 | 45.7 | 3.25 | 0.07 | 48.0 |
| 450 | 10.02 | 0.13 | 76.6 | 5.20 | 0.06 | 85.1 |

TABLE 3b-continued

The He and N2 Permeances of 1 and 10" tubes*

| Temperature (°C.) | Si235 (1") | | | Si483 (10") | | |
|---|---|---|---|---|---|---|
| | Permeance | | He/ | Permeance | | He/ |
| | He | N$_2$ | N$_2$ | He | N$_2$ | N$_2$ |
| 600 | 14.28 | 0.10 | 138.6 | 6.02 | 0.06 | 105.8 |

Permeance: m$^3$/m$^2$/hr/atm
*CVD at 300° C., Post-treated at 600° C. for 12 hours in He/O2 flow.

EXAMPLE IV

A membrane (S257) developed under the conditions described in Table 3a was employed for gas separation study for some light hydrocarbons, such as propane and isobutane.

Figure 4:
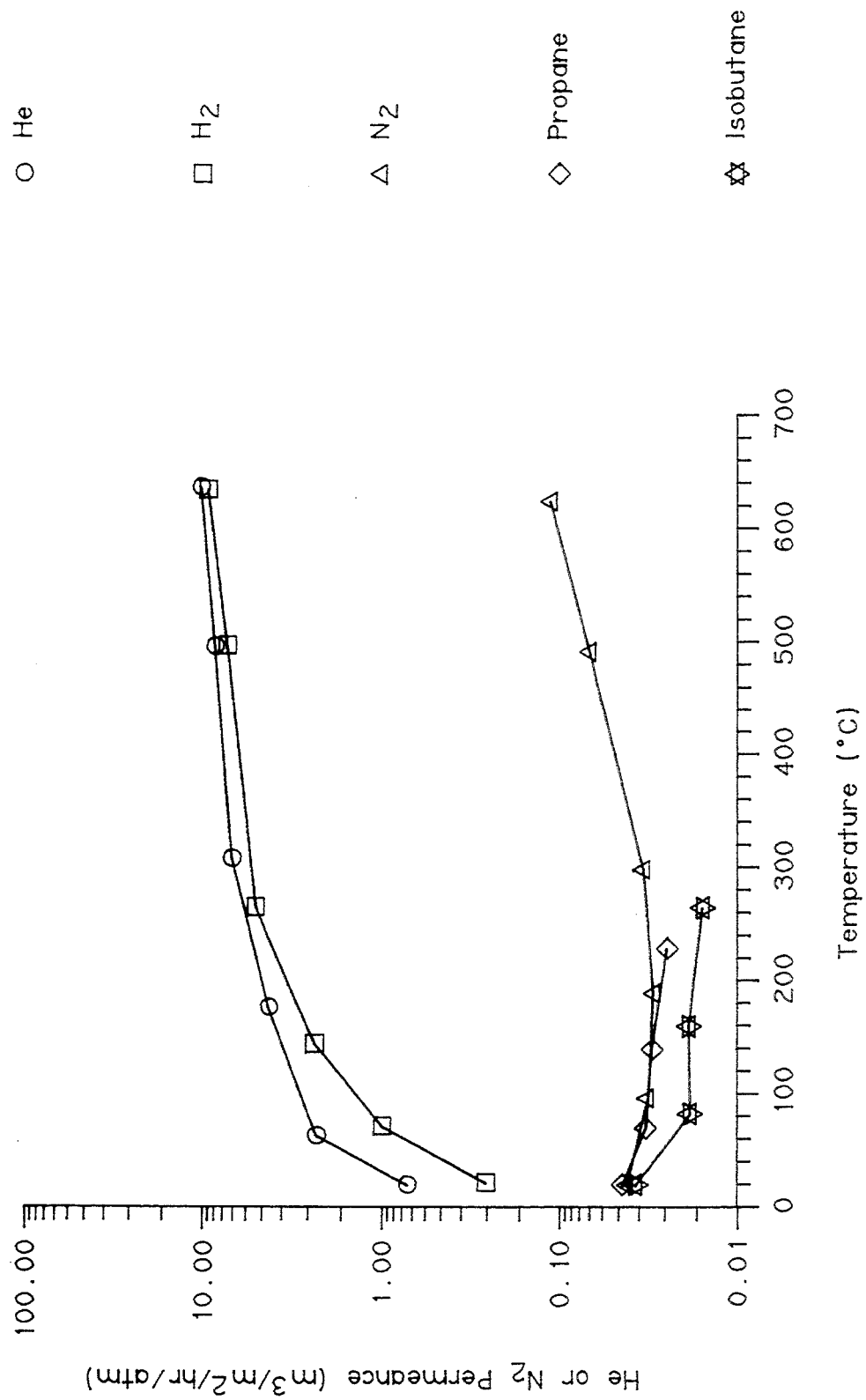
FIG. 4 shows a graph depicting the gas permeation through the silicon-oxide-modified ceramic membrane of the present invention.

The results are summarized in FIG. 4. This Example IV membrane demonstrated a hydrogen permeance of ~10 m$^3$/m$^2$/atm/hr at 600° C., while maintaining a minimal nitrogen permeance, about 0.15 m$^3$/m$^2$/atm/hr. The resulting selectivity for hydrogen over nitrogen was about ~100. The propane permeance through this membrane was similar to that of nitrogen at 25° to 250° C. The isobutane permeance, ~0.02 m$^3$/m$^2$/atm/hr, was lower than that of nitrogen in the same temperature range. The separation of hydrogen from propane and isobutane would be similar or better than the separation of hydrogen from nitrogen.

EXAMPLE V

Figure 5:
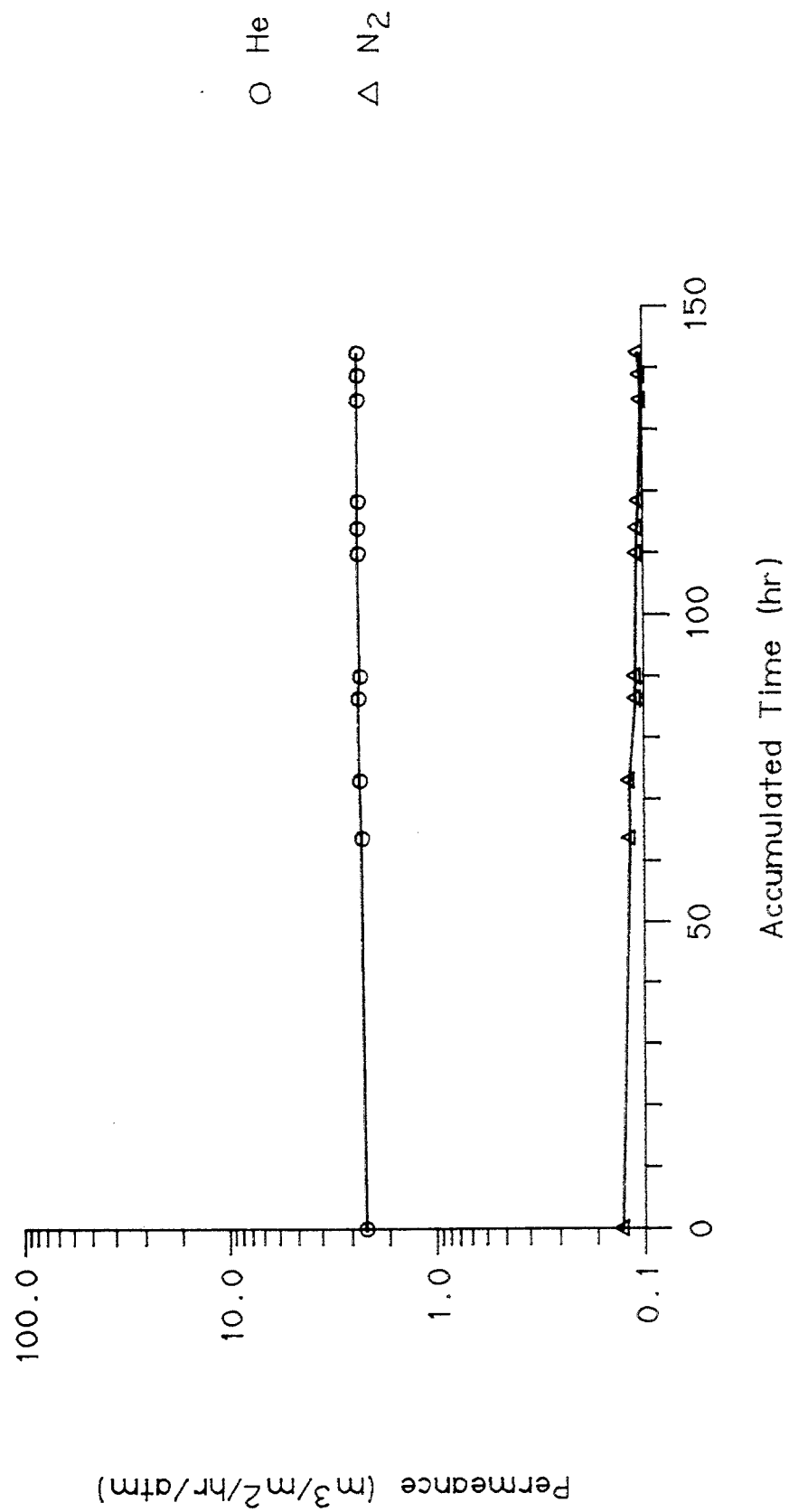
FIG. 5 shows a graph depicting the helium and nitrogen permeances during thermal stability tests at 600° C.

A membrane (Si235) developed under the conditions described in Table 3a was subjected to a thermal stability test. FIG. 5 shows the results for the thermal treatment at 600° C. under nitrogen flow. Initially, the helium and nitrogen permeances were about 14 and 0.15 m$^3$/m$^2$/atm/hr, respectively. After 130 hours, the He and N$_2$ permeances were almost unchanged. This result demonstrated the membrane post-treated at 600° C. maintained an excellent stability at the same temperature.

The preparation method described in accordance with the process of the present invention is different from a one step preparation at a given temperature as in the prior art. The resulting membranes of the present invention demonstrated an extremely high permeance. The apparatus, processes, and membranes of the present invention also are seen to be significantly different from processes using inorganic metallic precursors, such as metal hydrides and chlorides. Deposition temperature was varied from 100° C. to 800° C., resulting in a very dense film with a low permeance. In some cases, annealing in the presence of nitrogen or water will obtain the temperature stability through further densification of the film. The use of metallic chloride (in addition) produced HCl, a corrosive gas which is difficult to handle and requires special hardware for the deposition process at a high temperature.

In the present invention, a selected organic precursor was deposited at a lower temperature which then was further converted into its metal oxide at a higher temperature in the presence of oxidants. The membrane thus formed shows a very porous structure indicated by the permeance of hydrogen ranging from 1 to 15 m$^3$/m$^2$/atm/hr at 600° C. This membrane was stable in a test with >100 hours.

The present invention is different from CVD with an organic precursor at high temperatures, e.g., wherein the high temperature (750° C.) was applied to deposit an oxide film with a lower permeance. At these high temperatures, further heat treatment results in a permeance reduction, which is opposite from the processes and membranes of the present invention.

Thus it can be seen that the invention accomplishes all of its objectives.

The apparatus, membrane, and processes of the present invention are not limited to the descriptions of specific embodiments presented hereinabove, but rather the apparatus and process of the present invention should be viewed in terms of the claims that follow and equivalents thereof. Further, while the invention has been described in conjunction with several such specific embodiments, it is to be understood that many alternatives, modifications, and variations will be apparent to those skilled in the art in light of the foregoing detailed descriptions. Accordingly, this invention is intended to embrace all such alternatives, modifications, and variations which fall within the spirit and scope of the appended claims.

What is claimed is:

1. A process of depositing a metal oxide film into or on a porous ceramic support through chemical vapor deposition, comprising:
   a. passing a gas stream containing an organic metal oxide precursor and an oxidant through the porous ceramic support at a deposition temperature below about 550° C. to form a deposited film, and
   b. oxidizing said deposited film at an oxidizing temperature higher than said deposition temperature to produce a semipermeable metal oxide membrane on the ceramic support,
   c. thereby forming a membrane having a selectivity higher than Knudsen selectivity and a permeance higher than about 0.5 m$^3$/m$^2$/hr/atm as measured with hydrogen at 600° C.

2. The process of depositing a metal oxide film into or on a porous ceramic support through chemical vapor deposition as set forth in claim 1 wherein said metal oxide film comprises a metal oxide selected from the group consisting of aluminum oxide and zirconium oxide.

3. The process of depositing a metal oxide film into or on a porous ceramic support through chemical vapor deposition as set forth in claim 2 wherein said precursor comprises an organometallic compound containing a metal selected from the group consisting of aluminum and zirconium.

4. The process of depositing a metal oxide film into or on a porous ceramic support through chemical vapor deposition as set forth in claim 1 wherein said deposition temperature is about 200° C. to 550° C. and said oxidizing temperature is at least 50° C. above said deposition temperature.

5. The process of depositing a metal oxide film into or on a porous ceramic support through chemical vapor deposition as set forth in claim 4 wherein said deposition temperature is about 300° C., said deposition period is about 420 minutes plus or minus about 40 minutes, and said oxidizing temperature is at least 50° C. above said deposition temperature.

6. The process of depositing a metal oxide film into or on a porous ceramic support through chemical vapor deposition as set forth in claim 1 wherein said oxidant comprises oxygen.

7. The process of depositing a metal oxide film into or on a porous ceramic support through chemical vapor deposition as set forth in claim 1 wherein said ceramic support has a configuration selected from the group consisting of tubular, disk, and monolithic.

8. The process of depositing a metal oxide film into or on a porous ceramic support through chemical vapor deposition as set forth in claim 1 wherein said ceramic support has a multilayer asymmetric structure.

9. The process of depositing a metal oxide film into or on a porous ceramic support through chemical vapor deposition as set forth in claim 1 wherein said ceramic support comprises porous aluminum oxide, and the pore size of an effective layer of said membrane is less than or equal to about $0.2\mu$.

10. The process of depositing a metal oxide film into or on a porous ceramic support through chemical vapor deposition as set forth in claim 1 wherein said ceramic support comprises porous aluminum oxide, and the pore size of an effective layer of said membrane is less than or equal to about 1000 Å.

11. The process of depositing a metal oxide film into or on a porous ceramic support through chemical vapor deposition as set forth in claim 1 wherein said ceramic support comprises porous aluminum oxide, and the pore size of an effective layer of said membrane is less than or equal to about 100 Å.

12. A process of producing a semipermeable oxide membrane on ceramic support, comprising:
   a. passing an organic precursor of tetraethyl orthosilicate and oxygen through a porous aluminum oxide support at a chemical vapor deposition temperature below about 550° C. over a deposition period of about 420 minutes plus or minus about 40 minutes to form a deposited silicon oxide film, and
   b. oxidizing said deposited silicon oxide film at an oxidizing temperature at least about 50° C. higher than said deposition temperature to produce a semipermeable silicon oxide membrane on said aluminum oxide support having a pore size of an effective layer of said membrane less than or equal to about 40Å, a selectivity higher than Knudsen selectivity and a permeance higher than about 0.5 $m^3/m^2/hr/atm$ as measured with hydrogen at 600° C.

13. A process of depositing a nonmetallic solid oxide film into or on a porous ceramic support through chemical vapor deposition, comprising:
   a. passing a gas stream containing an organic nonmetallic solid oxide precursor and an oxidant through the porous ceramic support at a deposition temperature below about 550° C. to form a deposited film, and
   b. oxidizing said deposited film at an oxidizing temperature higher than said deposition temperature to produce a semipermeable nonmetallic solid oxide membrane on the ceramic support,
   c. thereby forming a membrane having a selectivity higher than Knudsen selectivity and a permeance higher than about 0.5 $m^3/m^2/hr/atm$ as measured with hydrogen at 600° C.

14. The process of depositing a nonmetallic solid oxide film into or on a porous ceramic support through chemical vapor deposition as set forth in claim 13 wherein said nonmetallic solid oxide film is silicon oxide.

15. The process of depositing a nonmetallic solid oxide film into or on a porous ceramic support through chemical vapor deposition as set forth in claim 14 wherein said organic nonmetallic solid oxide precursor is tetraethyl orthosilicate.

16. The process of depositing a nonmetallic solid oxide film into or on a porous ceramic support through chemical vapor deposition as set forth in claim 13 wherein said deposition temperature is about 200° C. to 550° C. and said oxidizing temperature is at least 50° C. above said deposition temperature.

17. The process of depositing a nonmetallic solid oxide film into or on a porous ceramic support through chemical vapor deposition as set forth in claim 16 wherein said deposition temperature is about 300° C., said deposition period is about 420 minutes plus or minus about 40 minutes, and said oxidizing temperature is at least 50° C. above said deposition temperature.

18. The process of depositing a nonmetallic solid oxide film into or on a porous ceramic support through chemical vapor deposition as set forth in claim 13 wherein said oxidant comprises oxygen.

19. The process of depositing a nonmetallic solid oxide film into or on a porous ceramic support through chemical vapor deposition as set forth in claim 13 wherein said ceramic support has a configuration selected from the group consisting of tubular, disk, and monolithic.

20. The process of depositing a nonmetallic solid oxide film into or on a porous ceramic support through chemical vapor deposition as set forth in claim 13 wherein said ceramic support has a multilayer asymmetric structure comprising porous aluminum oxide, and the pore size of an effective layer of said membrane is less than or equal to about $0.2\mu$.

* * * * *